(12) United States Patent
Kim et al.

(10) Patent No.: US 7,768,336 B2
(45) Date of Patent: Aug. 3, 2010

(54) LEVEL SHIFTING CIRCUIT

(75) Inventors: Chung-hee Kim, Yongin-si (KR);
Min-su Kim, Hwaseong-si (KR);
Jin-soo Park, Yongin-si (KR)

(73) Assignee: Samsung Electronics Co., Ltd., Suwon-Si (KR)

(*) Notice: Subject to any disclaimer, the term of this patent is extended or adjusted under 35 U.S.C. 154(b) by 0 days.

(21) Appl. No.: 12/208,056

(22) Filed: Sep. 10, 2008

(65) Prior Publication Data

US 2009/0201069 A1 Aug. 13, 2009

(30) Foreign Application Priority Data

Feb. 11, 2008 (KR) .................... 10-2008-0012208

(51) Int. Cl.
*H03L 5/00* (2006.01)

(52) U.S. Cl. .................... 327/333; 326/62; 326/81

(58) Field of Classification Search ............ 326/62–63, 326/80–81; 327/306, 333
See application file for complete search history.

(56) References Cited

U.S. PATENT DOCUMENTS 5,973,900 A * 10/1999 Sher .................... 361/91.5
6,720,802 B2 * 4/2004 Cho .................... 327/108
6,753,698 B2 * 6/2004 Carpenter et al. ........... 326/83
6,937,065 B2 * 8/2005 Aoki .................... 326/81
7,230,475 B2 * 6/2007 Choi et al. .................... 327/544

FOREIGN PATENT DOCUMENTS

| JP | 6-188718 | 7/1994 |
| KR | 2002-0076903 | 10/2002 |
| KR | 10-2006-0065070 | 6/2006 |
| KR | 10-2006-0119667 | 11/2006 |

* cited by examiner

*Primary Examiner*—Dinh T. Le
(74) *Attorney, Agent, or Firm*—F. Chau & Associates, LLC

(57) ABSTRACT

A level shifting circuit includes a first level shifting unit including a plurality of signal transfer units; a first operation control unit inactivating some of signal transfer units of the first level shifting unit in response to a clamping signal; a second level shifting unit connected in parallel to the first level shifting unit and comprising a plurality of signal transfer units; a second operation control unit inactivating some of signal transfer units of the second level shifting unit in response to the clamping signal; a signal output unit connected to output ends of the first and second level shifting units; and a clamping unit fixing the output ends of the first and second level shifting units to a predetermined voltage level in response to the clamping signal.

19 Claims, 4 Drawing Sheets

LEVEL SHIFTING CIRCUIT

CROSS-REFERENCE TO RELATED PATENT APPLICATION

This application is based on and claims priority from Korean Patent Application No. 10-2008-0012208, filed on Feb. 11, 2008, the disclosure of which is incorporated herein in its entirety by reference.

BACKGROUND OF THE INVENTION

1. Technical Field

The present disclosure relates to a level shifting circuit, and more particularly, to a level shifting circuit capable of maintaining a duty rate irrespective of a voltage change and capable of fixing its output to a specific voltage level.

2. Discussion of the Related Art

Mobile devices guarantee proper performance during an extended period of time using a limited battery. A variety of methods have been introduced in order to guarantee such performance one of which is to use different voltages in different block units. In this case, a high voltage is applied to a block requiring a high performance, and a low voltage is applied to a block requiring a low performance.

Since blocks use different voltages, a leakage current increases due to a voltage difference between interfaces of different blocks or when a problem occurs in a circuit operation.

To address these problems, a level shifter is used. The level shifter changes a level of a received voltage. The level shifter is disposed between blocks that use different voltages, thereby preventing the leakage current or circuit malfunction that may occur in blocks using different voltages.

SUMMARY OF THE INVENTION

Embodiments of the present invention seek to provide a level shifting circuit capable of maintaining a duty rate irrespective of a voltage change.

Further, embodiments of the present invention seek to provide a level shifting circuit that fixes an output to a specific voltage level for a specific mode.

Furthermore, embodiments of the present invention seek to provide a level shifting circuit that blocks parts of signal transfer units from an operation voltage or a ground for a specific mode.

A level shifting circuit, according to an exemplary embodiment of the present invention, comprises a first level shifting unit comprising a plurality of signal transfer units; a first operation control unit inactivating some of signal transfer units of the first level shifting unit in response to a clamping signal; a second level shifting unit connected in parallel to the first level shifting unit and comprising a plurality of signal transfer units; a second operation control unit inactivating some of signal transfer units of the second level shifting unit in response to the clamping signal; a signal output unit connected to output ends of the first and second level shifting units; and a clamping unit fixing the output ends of the first and second level shifting units to a predetermined voltage level in response to the clamping signal.

The first and second operation control units may connect some of the signal transfer units of the first and second level shifting units to ground, or to a first voltage or to a second voltage in response to a level of the clamping signal.

Each of the first and second operation control units may comprise a gate receiving the clamping signal; a first end connected to a signal transfer unit; and a second end connected to the ground, the first voltage, or the second voltage.

BRIEF DESCRIPTION OF THE DRAWINGS

Exemplary embodiments of the present invention will become apparent by reference to the following detailed description taken in conjunction with the attached drawings, wherein.

DETAILED DESCRIPTION OF EXEMPLARY EMBODIMENTS

Figure 1:
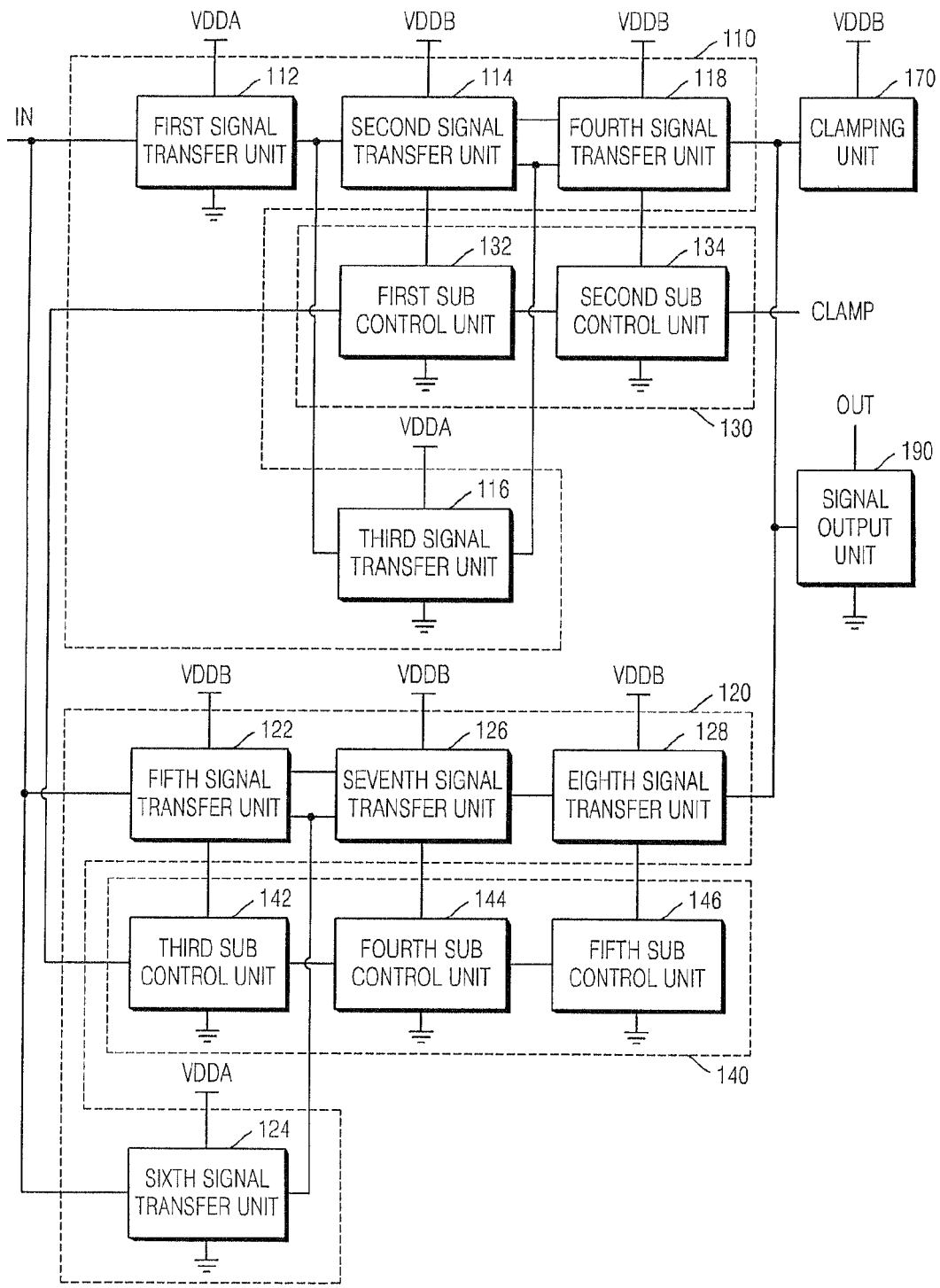
FIG. 1 is a block diagram of a level shifting circuit according to an exemplary embodiment of the present invention.

Hereinafter, exemplary embodiments of the present invention will be described in detail with reference to the accompanying drawings. Like reference numerals in the drawings denote like elements across various figures.

FIG. 1 is a block diagram of a level shifting circuit according to an exemplary embodiment of the present invention. Referring to FIG. 1, the level shifting circuit comprises a first level shifting unit 110, a first operation control unit 130, a second level shifting unit 120, a second operation control unit 140, a signal output unit 190, and a clamping unit 170.

The first level shifting unit 110 and the second level shifting unit 120 comprises a plurality of signal transfer units that transit-delay a signal. For example, each of the first level shifting unit 110 and the second level shifting unit 120 may comprise four signal transfer units. The first level shifting unit 110 and the second level shifting unit 120 receive a logic signal input through IN. Each of the first operation control unit 130 and the second operation control unit 140 is connected to the first level shifting unit 110 and the second level shifting unit 120, respectively, so that each of the first operation control unit 130 and the second operation control unit 140 inactivates some of the signal transfer units.

Each signal transfer unit comprises a plurality of signal transfer stages. When a signal input into each signal transfer unit transits from a logic high level to a logic low level, and from a logic low level to a logic high level, the signal passes through different signal transfer stages. Therefore, a transition delay time of the first level shifting unit 110 and the second level shifting unit 120, when the signal transits from a logic high level to a logic low level, and when the signal transits from a logic low level to a logic high level are different from each other.

When the voltage level supplied to the signal transfer unit changes, the transition delay time of the signal transfer stages included in the signal transfer unit changes so that the transition delay time of the first level shifting unit 110 and the second level shifting unit 120, when the signal transits from a logic high level to a logic low level may change, and when the signal transits from a logic low level to a logic high level may change.

In the present embodiment, although levels of supplied operation voltages VDDA and VDDB change, a signal transfer path is selected so that the transition delay time of the first level shifting unit 110 and the second level shifting unit 120 when the signal transits from the logic high level to the logic low level, and when the signal transits from the logic low level to the logic high level change by the same amount of time. Therefore, a duty rate of output signals of the first level shifting unit 110 and the second level shifting unit 120 may not change.

Referring to FIG. 1, the first level shifting unit 110 and the second level shifting unit 120 are connected in parallel. An average signal of output signals of the first level shifting unit 110 and the second level shifting unit 120 is output to output ends of the first level shifting unit 110 and the second level shifting unit 120. The signal transfer path is selected so that the transition delay time of the average signal when the signal transits from a logic high level to a logic low level, and the transition delay time of the average signal when the signal transits from a logic low level to a logic high level change by the same amount of time.

The signal output unit 190 is connected to the output ends of the first level shifting unit 110 and the second level shifting unit 120, transit-delays the average signal of the output ends, and generates an output signal OUT.

The clamping unit 170 fixes the output ends of the first level shifting unit 110 and the second level shifting unit 120 to a previously determined voltage level in response to a clamping signal CLAMP. Although the previously determined voltage level is the second voltage VDDB in an exemplary embodiment, it may be another voltage level.

The first operation control unit 130 inactivates some of the signal transfer units 112, 114, 116, and 118 of the first level shifting unit 110 in response to the clamping signal CLAMP. The second operation control unit 140 inactivates some of the signal transfer units 122, 124, 126, and 128 of the second level shifting unit 120 in response to the clamping signal CLAMP. To this end, some of the signal transfer units 112, 114, 116, 118, 122, 124, 126, and 128 are blocked from ground, so that some signal transfer units can be inactivated.

For example, a first sub control unit 132 is connected between the second signal transfer unit 114 and ground, so that the second transfer unit 114 is connected to ground or is blocked from ground by the first sub control unit 132. Likewise, the second through fifth sub control units 134, 142, 144, and 146 connect the fourth, fifth, seventh, and eighth signal transfer units 118, 122, 126, and 128, respectively, to ground or are blocked from ground.

Figure 2:
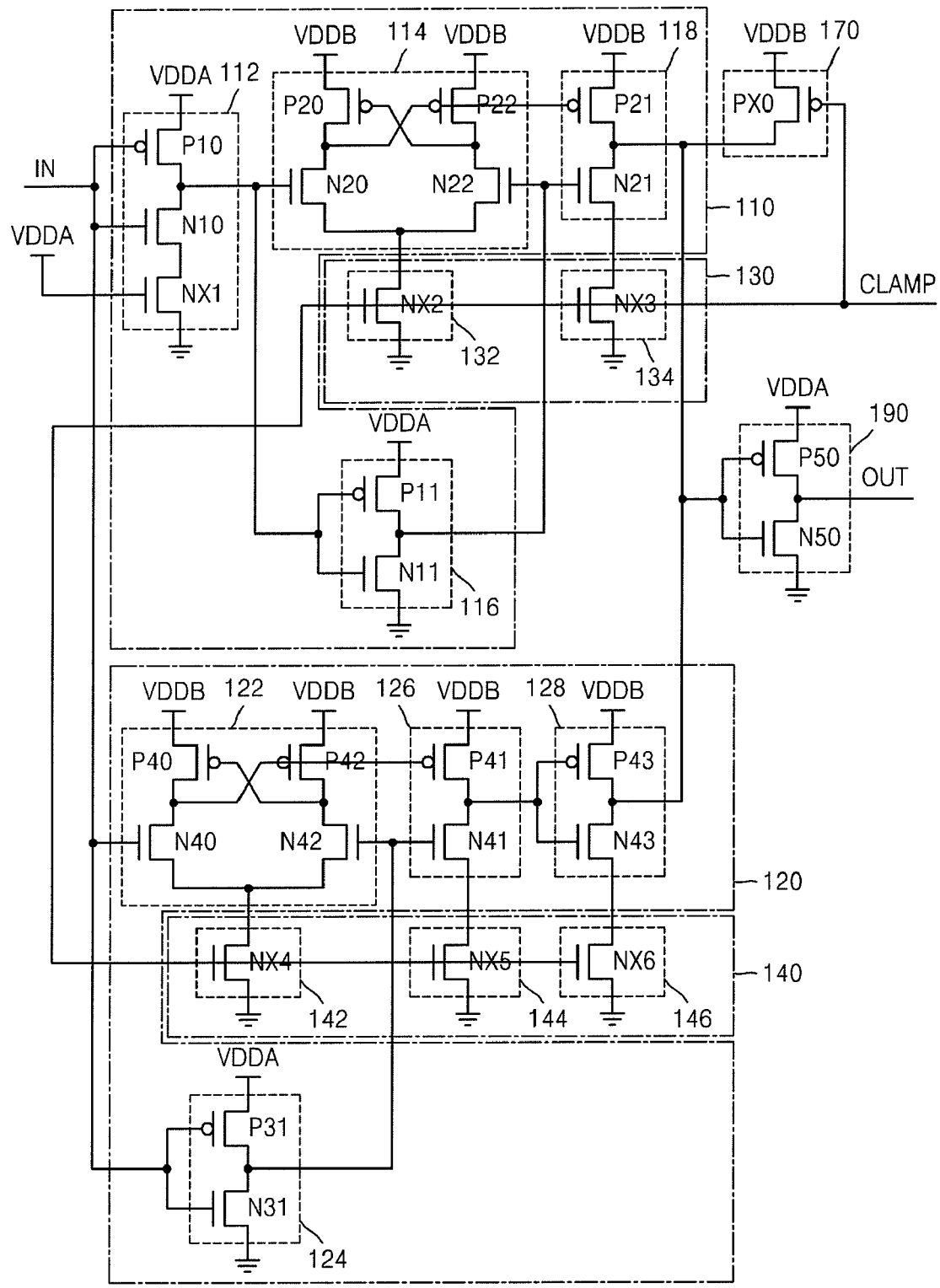
FIG. 2 is a circuit diagram of the level shifting circuit shown in FIG. 1 according to an exemplary embodiment of the present invention.

FIG. 2 is a circuit diagram of the level shifting circuit shown in FIG. 1 according to an exemplary embodiment of the present invention. Referring to FIG. 2, the clamping unit 170 may comprise a transistor PX0. For example, the transistor PX0 may comprise a gate receiving the clamping signal CLAMP, a first end connected to the second voltage VDDB, and a second end connected to an output end of the first level shifting unit 110 and the second level shifting unit 120. The first and second ends may be a source and drain, respectively. Alternatively, the first and second ends may be a drain and source, respectively.

When the clamping signal CLAMP has a logic low level, the transistor PX0 is turned on so that the output ends of the first level shifting unit 110 and the second level shifting unit 120 are fixed to the second voltage VDDB irrespective of the average output signal of the first level shifting unit 110 and the second level shifting unit 120. However, when the clamping signal has a logic high level, the transistor PX0 is turned off so that the average signal of the output signals of the first level shifting unit 110 and the second level shifting unit 120 is output to the output ends of the first level shifting unit 110 and the second level shifting unit 120.

Each sub control unit 132, 134, 142, 144, and 146 may comprise respective transistors NX2 through NX6. For example, the transistor NX2 may comprise a gate receiving the clamping signal CLAMP, a first end connected to the signal transfer unit 114, and a second end connected to ground.

When the clamping signal CLAMP has a logic high level, the transistor NX2 is turned on so that the signal transfer unit 114 is connected to ground and performs a signal transit delay operation. However, when the clamping signal CLAMP has a logic low level, the transistor NX2 is turned off and the signal transfer unit 114 is blocked from ground and does not operate. As such, a logic level of the clamping signal CLAMP is adjusted in order to determine whether to operate the signal transfer unit 114. If it is not necessary to operate the signal transfer unit 114, a leakage current of the signal transfer unit 114 can be prevented.

The first through fourth signal transfer units 112, 114, 116, and 118 included in the first level shifting unit 110 are used to transit-delay a signal, and may be inverters or differential amplifiers. For example, the first, third, and fourth signal transfer units 112, 116, and 118 may be inverters, and the second signal transfer unit 114 may be a differential amplifier. The fourth signal transfer unit 118 may perform a pull-up/pull-down function. Likewise, for example, the sixth through eighth signal transfer units 124, 126, and 128 may be inverters, and the fifth signal transfer unit 112 may be a differential amplifier. The seventh signal transfer unit 126 may perform the pull-up/pull-down function. Each signal transfer unit may be a signal transit delay unit other than an inverter and a differential amplifier.

Each signal transfer unit comprises a plurality of signal transfer stages. For example, the first signal transfer unit 112 may comprise a PMOS transistor P10 and an NMOS transistor N10. When an input signal IN transits from a logic high level to a logic low level, the input signal IN passes through the PMOS transistor P10. When the input signal IN transits from a logic low level to a logic high level, the input signal IN passes through the NMOS transistor N10.

A pass time (transit delay time) of the PMOS transistor P10 and the NMOS transistor N10 changes according to a level of the first voltage VDDA supplied to the first signal transfer unit 112. A gate-source voltage of the PMOS transistor P10 and the NMOS transistor N10 changes according to the level of the first voltage VDDA. When the gate-source voltage is high, the pass time of the PMOS transistor P10 and the NMOS transistor N10 decreases, whereas when the gate-source voltage is low, the pass time of the PMOS transistor P10 and the NMOS transistor N10 increases.

A transit delay time of the first signal transfer unit 112 changes according to the logic level of the input signal IN and the level of the first voltage VDDA. Likewise, a transit delay time of the signal transfer units 114, 116, 118, 122, 124, 126, and 128 changes according to the logic level of the input signal IN and the level of the supplied voltages VDDA and VDDB, and thus a transit delay time of the first and second level shifting units 110 and 120 changes.

In an embodiment of the present invention, although levels of supplied operation voltages VDDA and VDDB change, transistors are selected wherein the transition delay time of the first level shifting unit 110 and the second level shifting unit 120 when the signal transits from a logic high level to a logic low level, and when the signal transits from a logic low level to a logic high level change by the same amount of time.

Hereinafter, an operation where the first voltage VDDA is lower than the second voltage VDDB will now be described.

When the input signal IN transits from a first voltage VDDA level (logic high level) to a ground voltage level (logic low level), the transistors P10, N20, and N21 of the first level shifting unit 110 and transistors P31, N41, and P43 of the second level shifting unit 120 are turned on. Therefore, the input signal IN passes through the transistors P10, N20, and P21 of the first level shifting unit 110, and passes through the transistors P31, N41, and P43 of the second level shifting unit 120.

In this case, since the first voltage VDDA is lower than the second voltage VDDB, the gate-source voltage of the transistor P10 is lower than that of the transistor P21. Therefore, a pass time of the transistor P10 is longer than that of the transistor P21. Likewise, the pass time of the transistor N20 included in the first level shifting unit 110 is longer than that of the transistor P21. The pass time of the transistors P31 and N41 included in the second level shifting unit 120 is long and the pass time of the transistor P43 is short. Hereinafter, a long pass time of a transistor is indicated by "L", and a short pass time is indicated by "S".

Therefore, the total pass time of the first level shifting unit 110 is "L(P10)+L(N20)+S(P21)=2L1S". The total pass time of the second level shifting unit 120 is "L(P31)+L(N41)+S (P43)=2L1S". Thus, an average pass time of the first and second level shifting units 110 and 120 is "2L1S".

When the input signal IN transitions from a ground voltage level (logic low level) to a logic high level (first voltage VDDA level), the transistors N10, P11, and N21 of the first level shifting unit 110 and transistors P40, P41, and N43 of the second level shifting unit 120 are turned on. Therefore, the input signal IN passes through the transistors N10, P11, and N21 of the first level shifting unit 110, and passes through the transistors P40, P41, and N43 of the second level shifting unit 120.

In this case, since the first voltage VDDA is lower than the second voltage VDDB, the pass time of the transistors N10, P11, and N21 included in the first level shifting unit 110 is long. The pass time of the transistor N40 included in the second level shifting unit 120 is long and the pass time of the transistors P41 and N43 is short.

Therefore, the total pass time of the first level shifting unit 110 is "L(N10)+L(P11)+L(N21)=3L". The total pass time of the second level shifting unit 120 is "L(N40)+L(P41)+S (N43)=1L2S". Thus, an average pass time of the first and second level shifting units 110 and 120 is "2L1S".

Hereinafter, an operation where the first voltage VDDA is higher than the second voltage VDDB will now be described.

When the input signal IN transitions from a logic high level to a logic low level, since the first voltage VDDA is higher than the second voltage VDDB, the pass time of the transistors P10 and N20 included in the first level shifting unit 110 is short and the pass time of the transistor P21 is long. The pass time of the transistors P31 and N41 included in the second level shifting unit 120 is short and the pass time of the transistor P43 is long.

Therefore, the total pass time of the first level shifting unit 110 is "S(P10)+S(N20)+L(P21)=1L2S". The total pass time of the second level shifting unit 120 is "S(P31)+S(N41)+L (P43)=1L2S". Thus, the average pass time of the first and second level shifting units 110 and 120 is "1L2S".

When the input signal IN transitions from a logic low level to a logic high level (first voltage VDDA level), since the first voltage VDDA is higher than the second voltage VDDB, the pass time of the transistors N10, P11, and N21 included in the first level shifting unit 110 is short. The pass time of the transistor N40 included in the second level shifting unit 120 is short and the pass time of the transistors P41 and N43 is long.

Therefore, the total pass time of the first level shifting unit 110 is "S(N10)+S(P11)+S(N21)=3S". The total pass time of the second level shifting unit 120 is "S(N40)+L(P41)+L (N43)=2L1S". Thus, an average pass time of the first and second level shifting units 110 and 120 is "1L2S".

During a level change in the first and second voltages VDDA and VDDB, when the logic level of the input signal IN transitions, the average pass time of the first and second level shifting units 110 and 120 transitions between 2L1S and 1L2S. In more detail, the transition delay time of the average signal when the signal transitions from a logic high level to a logic low level, and the transition delay time of the average signal when the signal transitions from a logic low level to a logic high level changes by the same amount of time. Therefore, a duty rate of the output signals OUT of the first level shifting unit 110 and the second level shifting unit 120 remains unchanged.

Figure 3:
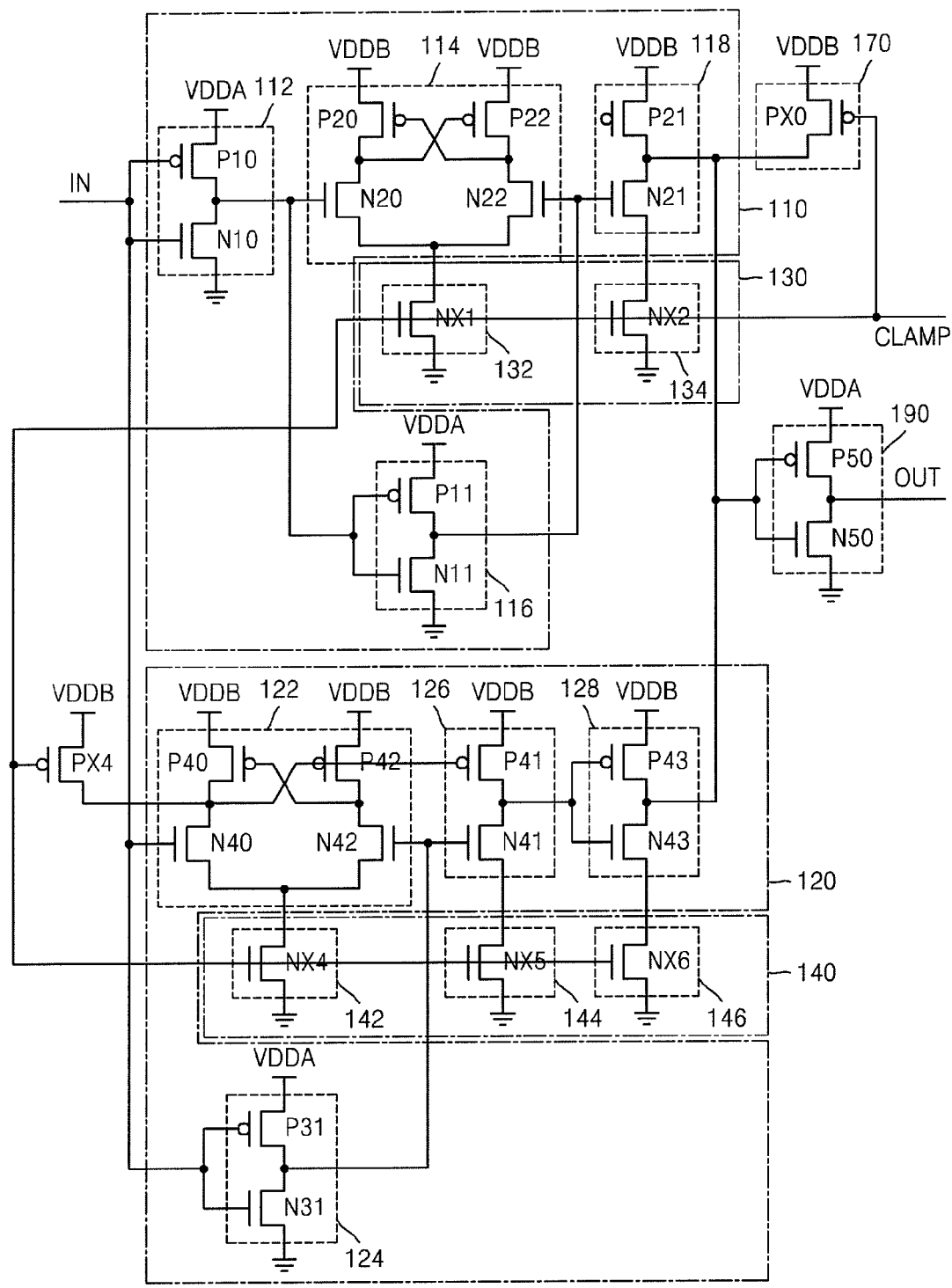
FIG. 3 is a circuit diagram of the level shifting circuit shown in FIG. 1 according to an exemplary embodiment of the present invention.

FIG. 3 is a circuit diagram of the level shifting circuit shown in FIG. 1 according to an exemplary embodiment of the present invention. In comparison with FIGS. 2 and 3, the level shifting circuit shown in FIG. 2 comprises a transistor NX1, whereas the level shifting circuit shown in FIG. 3 comprises a transistor PX4. Since the construction of the level shifting circuit shown in FIG. 3 corresponds to that of the level shifting circuit shown in FIG. 2, the detailed description thereof will not be repeated.

Figure 4:
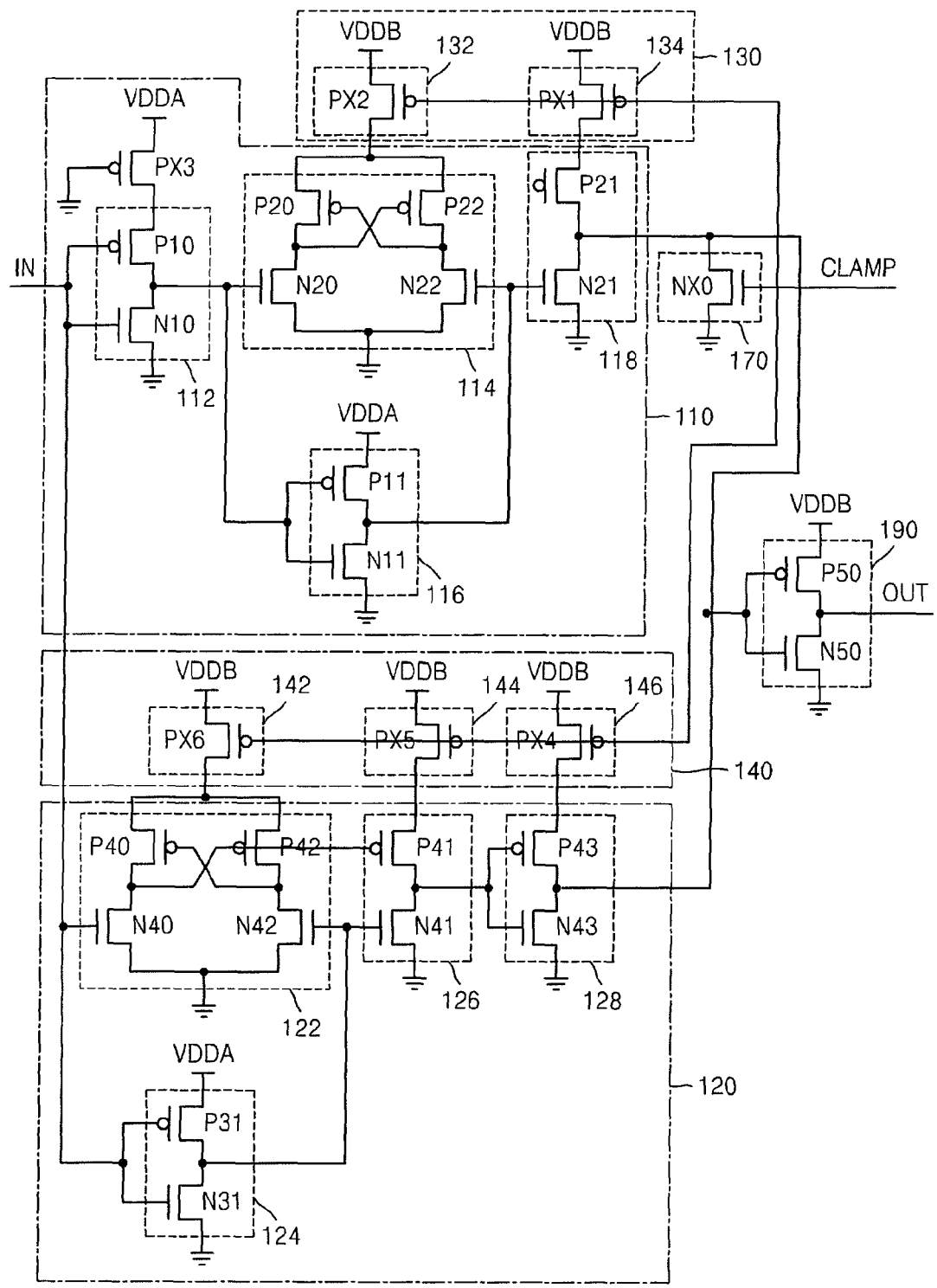
FIG. 4 is a circuit diagram of a level shifting circuit according to an exemplary embodiment of the present invention.

FIG. 4 is a circuit diagram of a level shifting circuit according to an exemplary embodiment of the present invention. Referring to FIG. 4, first and second level shifting units 110 and 120 correspond to the first and second level shifting units 110 and 120, and thus the detailed description thereof will not be repeated.

A clamping unit 170 that comprises an NMOS transistor NX0 differs from the clamping unit 170 shown in FIG. 2. The transistor NX0 may comprise a gate receiving a clamping signal CLAMP, a first end connected to ground, and a second end connected to output ends of the first and second level shifting units 110 and 120.

When the clamping signal CLAMP has a logic high level, the transistor NX0 is turned on, and the output ends of the first and second level shifting units 110 and 120 are fixed to a ground voltage irrespective of an average output signal of the first and second level shifting units 110 and 120. Meanwhile, if the clamping signal CLAMP has a logic low level, the transistor NX0 is turned off, and the average output signal of the first and second level shifting units 110 and 120 is output to the output ends of the first and second level shifting units 110 and 120.

First and second operation control units 130 and 140 that comprise PMOS transistors PX1 through PX6 are distinguished from the first and second control units 130 and 140 shown in FIG. 2. For example, the transistor PX1 may comprise a gate receiving a clamping signal CLAMP, a first end connected to a signal transfer unit 118, and a second end connected to a second voltage VDDB.

When the clamping signal CLAMP has a logic low level, the transistor PX1 is turned on so that the signal transfer unit 118 is connected to the second voltage VDDB and performs a signal transit delay operation. However, when the clamping signal CLAMP has a logic high level, the transistor PX1 is turned off and the signal transfer unit 118 is blocked from the second voltage VDDB and does not operate. Therefore, a logic level of the clamping signal CLAMP is adjusted in order to determine whether to operate the signal transfer unit 118. If it is not necessary to operate the signal transfer unit 118, a leakage current of the signal transfer unit 118 can be prevented.

The level shifting circuit shown in FIG. 2 may not comprise signal transfer units 118 and 126 and sub control units 134 and 144. In this case, the first level shifting unit 110 may comprise a first inverter receiving an input signal and operating based on a first voltage, a first differential amplifier connected to an output end of the first inverter and operating based on a second voltage, and a second inverter in parallel to the first differential amplifier and connected to an output end of the first inverter and operating based on the first voltage. The first control unit may comprise a first sub control unit connected between the first differential amplifier and ground. The clamping unit may be connected between an output end of the first differential amplifier and the second voltage. The second level shifting unit may comprise a second differential amplifier receiving the input signal and operating based on the second voltage, a third inverter receiving the input signal, connected in parallel to the second differential amplifier, and operating based on the first voltage, and a fourth inverter connected to an output end of the second differential amplifier. The second operation control unit may comprise a second sub control unit connected between the second differential amplifier and ground and a third sub control unit connected between the third inverter and ground. The clamping unit may be connected between an output end of the fourth inverter and the second voltage.

The level shifting circuit according to exemplary embodiments of the present invention is capable of maintaining a duty rate irrespective of a voltage change, and is capable of fixing an output to a specific voltage level for a specific mode.

Further, parts of signal transfer units are blocked from an operation voltage or a ground for a specific mode, thereby preventing a leakage current.

Although exemplary embodiments of the present invention have been described for illustrative purposes, those skilled in the art will appreciate that various modifications, additions and substitutions are possible, without departing from the scope and spirit of the disclosure.

What is claimed is:

1. A level shifting circuit comprising:
   a first level shifting unit responsive to an input signal and comprising a plurality of signal transfer units;
   a first operation control unit connected of the first level shifting unit and that inactivates some of the plurality of signal transfer units of the first level shifting unit in response to a clamping signal;
   a second level shifting unit connected in parallel to the first level shifting unit, responsive to the input signal and comprising a plurality of signal transfer units;
   a second operation control unit connected to the second level shifting unit and that inactivates some of signal transfer units of the second level shifting unit in response to the clamping signal;
   a signal output unit connected to output ends of the first and second level shifting units; and
   a clamping unit that fixes the output ends of the first and second level shifting units to a predetermined voltage level in response to the clamping signal.

2. The level shifting circuit of claim 1, wherein the first and second operation control units connect said some of the plurality of signal transfer units of the first and second level shifting units to at least one of ground, a first voltage, and a second voltage in response to a first level of the clamping signal, and disconnect or block other signal transfer units of the first and second level shifting units from at least one of ground, the first voltage and the second voltage in response to a second level of the clamping signal.

3. The level shifting circuit of claim 2, wherein each of the first and second operation control units comprises:
   a gate that receives the clamping signal;
   a first end connected to the signal transfer unit; and
   a second end connected to at least one of ground, the first voltage, and the second voltage.

4. The level shifting circuit of claim 1, wherein the clamping unit maintains a voltage level of the output ends of the first and second level shifting units when the clamping signal has a first level, and fixes the output ends of the first and second level shifting units to the predetermined voltage level when the clamping signal has a second level.

5. The level shifting circuit of claim 4, wherein the clamping unit comprises:
   a gate that receives the clamping signal;
   a first end connected to at least one of the first voltage, the second voltage, and ground; and
   a second end connected to the output ends of the first and second level shifting units.

6. The level shifting circuit of claim 1, wherein the first level shifting unit comprises:
   a first signal transfer unit receiving that receives the input signal and that operates based upon a first voltage;
   a second signal transfer unit connected to an output end of the first signal transfer unit and operating that operates based upon a second voltage;
   a third signal transfer unit, connected in parallel to the second signal transfer unit, and connected to an output end of the first signal transfer unit and that operates based upon the first voltage; and
   a fourth signal transfer unit comprising an output end connected to an input end of the signal output unit and that operates based upon the second voltage, and first and second input ends of the fourth signal transfer unit connected to respective first and second output ends of the second signal transfer unit.

7. The level shifting circuit of claim 6, wherein the first, third, and fourth signal transfer units are inverters, and the second signal transfer unit is a differential amplifier.

8. The level shifting circuit of claim 6, wherein the first operation control unit comprises:
   a first sub control unit connected between the second signal transfer unit and ground; and
   a second sub control unit connected between the fourth signal transfer unit and ground.

9. The level shifting circuit of claim 8, wherein the second level shifting unit comprises:
   a fifth signal transfer unit that receives the input signal and operating that operates based upon the second voltage;
   a sixth signal transfer unit that receives the input signal, connected in parallel to the fifth signal transfer unit, and that operates based upon the first voltage;
   a seventh signal transfer unit comprising first and second input ends each connected to first and second output ends of the fifth signal transfer unit and that operates based upon the second voltage; and
   an eight signal transfer unit comprising an output end connected to an input end of the signal output unit and that operates based upon the second voltage, and an input end of the eight signal transfer unit connected to an output end of the seventh signal transfer unit.

10. The level shifting circuit of claim 9, wherein the fifth signal transfer unit is a differential amplifier, and the sixth through eighth signal transfer units are inverters.

11. The level shifting circuit of claim 9, wherein the second operation control unit comprises:

a third sub control unit connected between the fifth signal transfer unit and ground;
a fourth sub control unit connected between the seventh signal transfer unit and ground; and
a fifth sub control unit connected between the eighth signal transfer unit and ground.

12. The level shifting circuit of claim 1, wherein at least one of the plurality of signal transfer units of the first level shifting unit comprises:
   a first inverter that receives the input signal and that operates based upon a first voltage;
   a first differential amplifier connected to an output end of the first inverter and that operates based a second voltage; and
   a second inverter, connected in parallel to the first differential amplifier, and connected to an output end of the first inverter and that operates based upon the first voltage, and
   wherein the first operation control unit comprises a first sub control unit connected between the first differential amplifier and ground, and
   wherein the clamping unit is connected between an output end of the first differential amplifier and the second voltage.

13. The level shifting circuit of claim 12, wherein the second level shifting unit comprises:
   a second differential amplifier that receives the input signal and that operates based upon the second voltage;
   a third inverter that receives the input signal, connected in parallel to the second differential amplifier, and that operates based upon the first voltage; and
   a fourth inverter connected to an output end of the second differential amplifier,
   wherein the second operation control unit comprises:
      a second sub control unit connected between the second differential amplifier and ground; and
      a third sub control unit connected between the third inverter and ground, and
   wherein the clamping unit is connected between an output end of the fourth inverter and the second voltage.

14. A level shifting circuit comprising:
a first level shifting unit responsive to an input signal;
a first operation control unit that controls the first level shifting unit in response to a clamping signal;
a second level shifting unit connected in parallel to the first level shifting unit and responsive to the input signal;
a second operation control unit controlling that controls the second level shifting unit responsive to the clamping signal; and
a clamping unit that fixes output ends of the first and second level shifting units to a predetermined voltage level in response to the clamping signal,
wherein the first level shifting unit comprises:
   a first signal transfer unit that receives the input signal and that operates based upon a first voltage;
   a second signal transfer unit connected to an output end of the first signal transfer unit and that operates based upon a second voltage;
   a third signal transfer unit connected in parallel to the second signal transfer unit, and connected to an output end of the first signal transfer unit and that operates based upon the first voltage; and
   a fourth signal transfer unit comprising an output end connected to an input end of the signal output unit and that operates based upon the second voltage, and first and second input ends of the fourth signal transfer unit connected to respective first and second output ends of the second signal transfer unit.

15. The level shifting circuit of claim 14, wherein the first operation control unit comprises:
   a first sub control unit connected between the second signal transfer unit and ground; and
   a second sub control unit connected between the fourth signal transfer unit and ground.

16. The level shifting circuit of claim 15, wherein the second level shifting unit comprises:
   a fifth signal transfer unit that receives the input signal and operating that operates based upon the second voltage;
   a sixth signal transfer unit that receives the input signal, connected in parallel to the fifth signal transfer unit, and that operates based upon the first voltage;
   a seventh signal transfer unit comprising first and second input ends each connected to first and second output ends of the fifth signal transfer unit and that operates based upon the second voltage; and
   an eight signal transfer unit comprising an output end connected to an input end of the signal output unit and that operates based upon the second voltage, and an input end of the eight signal transfer unit connected to an output end of the seventh signal transfer unit.

17. The level of shifting circuit of claim 16, wherein the second operation control unit comprises:
   a third sub control unit connected between the fifth signal transfer unit and ground;
   a fourth sub control unit connected between the seventh signal transfer unit and ground; and
   a fifth sub control unit connected between the eighth signal transfer unit and ground.

18. The level shifting circuit of claim 17, wherein the first, third, and fourth signal transfer units are inverters, and the second signal transfer unit is a differential amplifier.

19. The level shifting circuit of claim 18, wherein the fifth signal transfer unit is a differential amplifier, and the sixth through eighth signal transfer units are inverters.

* * * * *